(12) United States Patent
Pyo

(10) Patent No.: US 6,436,826 B1
(45) Date of Patent: Aug. 20, 2002

(54) METHOD OF FORMING A METAL WIRING IN A SEMICONDUCTOR DEVICE

(75) Inventor: Sung Gyu Pyo, Kyungki-Do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/875,623

(22) Filed: Jun. 6, 2001

(30) Foreign Application Priority Data

Jun. 20, 2000 (KR) .......................................... 00-33981

(51) Int. Cl.[7] .............................................. H01L 21/44
(52) U.S. Cl. ........................ 438/687; 438/653; 438/654
(58) Field of Search ................................ 438/687, 653, 438/654

(56) References Cited

U.S. PATENT DOCUMENTS

| | | | | |
|---|---|---|---|---|
| 6,010,962 A | * | 1/2000 | Liu et al. | 438/687 |
| 6,184,138 B1 | * | 2/2001 | Ho et al. | 438/687 |
| 6,271,136 B1 | * | 8/2001 | Shue et al. | 438/687 |
| 6,342,447 B1 | * | 1/2002 | Hoshino | 438/687 |

FOREIGN PATENT DOCUMENTS

EP 0954027 * 3/1999

* cited by examiner

*Primary Examiner*—Trung Dang
(74) *Attorney, Agent, or Firm*—Marshall, Gerstein & Borun

(57) ABSTRACT

A method of forming a metal wiring in a semiconductor device. In order to overcome the limitation of copper filling into the damascene pattern formed on an insulating film using copper as a metal wiring, a chemical enhancer layer is formed on the damascene pattern which is then filled with copper by depositing copper by means of MOCVD method using a copper precursor. The chemical enhancer is exposed to a plasma process or radical plasma process so that it remains only within a bottom portion of the damascene pattern. Therefore, a selective copper deposition within the damascene pattern is provided to accelerate the deposition speed of copper by CECVD method, thus overcoming the limitation of slow and incomplete copper filling for ultra-fine structures.

17 Claims, 2 Drawing Sheets

METHOD OF FORMING A METAL WIRING IN A SEMICONDUCTOR DEVICE

BACKGROUND OF THE INVENTION

1. Technical Field

A method of forming a metal wiring in a semiconductor device is disclosed. More particularly, the present invention relates to a method of forming a metal wiring in a semiconductor device by which a chemical enhancer layer is formed and copper filled in the damascene pattern by means of selective deposition method using a copper precursor to form a copper wiring.

2. Description of the Prior Art

As the size of a contact is reduced and the aspect ratio is increased for rapid high performance of next-generation semiconductor devices, a metal wiring using aluminum has a problem in that the EM characteristic in which the lifetime of the metal wiring is shortened due to high current density. In order to overcome this problem, a study has been made on a wiring material having low resistance. Recently, wiring material using copper (Cu) has been studied. Also, the commercialization of electroplating method considering cost and deposition speed has been studied. As the electroplating method, however, has a limitation in filling in case of ultra-fine structure, interest in a copper wiring filling using a CVD method has been generated.

The CVD method has a low efficiency due to a low deposition speed and cost, when compared with a wiring filling by means of electroplating method, but there has an effort to overcome this problem by introducing a new process method. One of these methods is a copper wiring filling using chemically enhanced CVD method (CECVD). The CECVD method is a new process method that overcomes the problem of a low deposition speed and an incomplete coverage. This CECVD method, however, still has the problems of uniformly spraying a chemical enhancer and an inability to distribute the chemical enhancer into a desired position for a selective copper filling process.

SUMMARY OF THE DISCLOSURE

A method of forming a metal wiring in a semiconductor device is disclosed that is capable of performing a selective deposition process of copper using a copper precursor and thus easily forming a copper wiring in an ultra-fine texture, by performing a chemical enhancer accelerating deposition of copper and then performing a plasma process or a radical plasma process to remain the chemical enhancer layer only at the bottom of the damascene pattern.

A disclosed method comprises: providing a substrate in which an insulating film having a damascene pattern is formed; forming a diffusion prevention film on said insulating film; forming a chemical enhancer layer on said diffusion prevention film; performing a plasma process so that said chemical enhancer layer can be remained at the bottom of said damascene pattern; forming a copper layer by means of chemical vapor deposition method; and performing a hydrogen reduction annealing and a chemical mechanical polishing process to form a copper metal wiring.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE PRESENTLY PREFERRED EMBODIMENTS

The disclosed method will be described in detail by way of a preferred embodiment with reference to accompanying drawings.

Figure 1A:
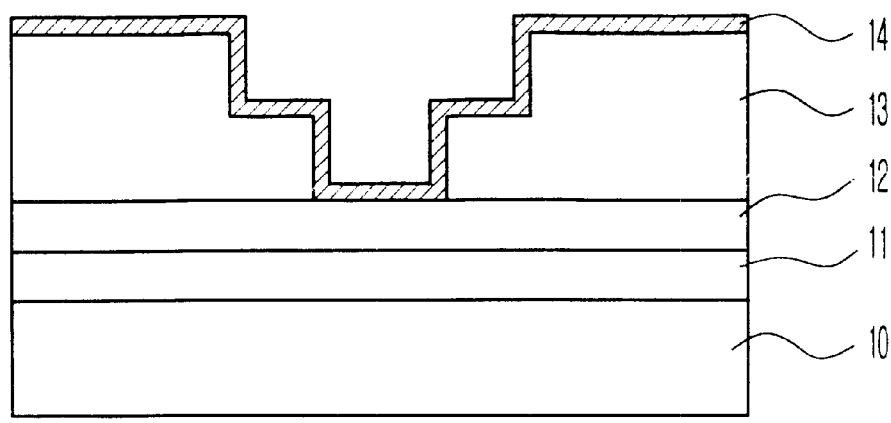
FIGS. 1A through 1E are cross-sectional views sequentially illustrating a method of forming a metal wiring in a semiconductor device according to the disclosure.

Referring now to FIG. 1A, an insulating film 11, a lower metal layer 12 and a second insulating film 13 are sequentially formed on a semiconductor substrate 10 in which various components for forming a semiconductor device is formed. A damascene pattern consisting of a trench and/or via is then formed in the second insulating film. Next, a cleaning is performed to remove an oxide layer remaining on the surface of the lower metal layer 12 exposed by the damascene pattern. Thereafter, a diffusion prevention film 14 is formed on the second insulating film 13 including the damascene pattern. The surface of the diffusion prevention film 14 is exposed to a plasma process in order to facilitate formation of a subsequent chemical enhancer layer 15a or a seed layer 15a which is formed in thickness ranging from about 50 to about 500 Å using copper (Cu) on the surface of the diffusion prevention film 14.

In the above, the second insulating film 13 is formed of an insulating material having a low dielectric constant, and the trench and via formed by the second insulating film 13 is formed in a dual damascene pattern. The cleaning process may employ RF plasma in case that the lower metal layer 12 is made of W and Al, or employ a reactive cleaning method in case that the first metal layer 12 is made of Cu. The diffusion prevention film 14 may be formed of at least one of ionized PVD TiN, CVD TiN, MOCVD TiN, ionized PVD Ta, ionized PVD TaN, CVD Ta, CVD TaN, CVD WN, CVD TiAlN, CVD TiSiN and CVD TaSiN.

Figure 1B:
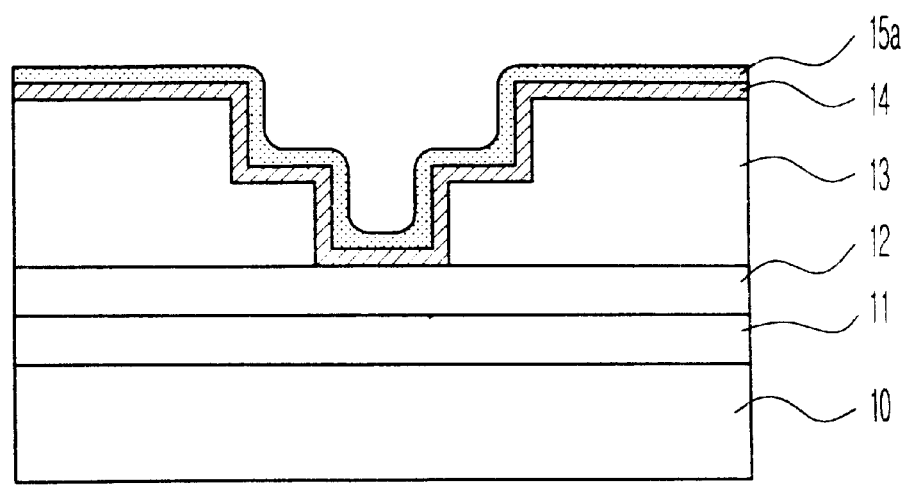

Referring now to FIG. 1B, a chemical enhancer layer 15a is formed on the diffusion prevention film 14. Catalysts for forming the chemical enhancer 15a may include one of I (iodine)-containing liquid compounds such as $CH_3I$, $C_2H_5I$, $CD_3I$, $CH_2I_2$ etc., Hhfac1/2H$_2$O, Hhfac, TMVS, pure $I_2$, I (iodine)-containing gas and water vapor, and is performed at the temperature ranging from about −20 to about 300° C. for a time period ranging from about 1 to about 600 seconds. Also, the catalyst may include F, Cl, Br, I or At in a liquid state that are Group VII elements from the Periodic Table or F, Cl, Br, I and At in a gas state.

Figure 1C:
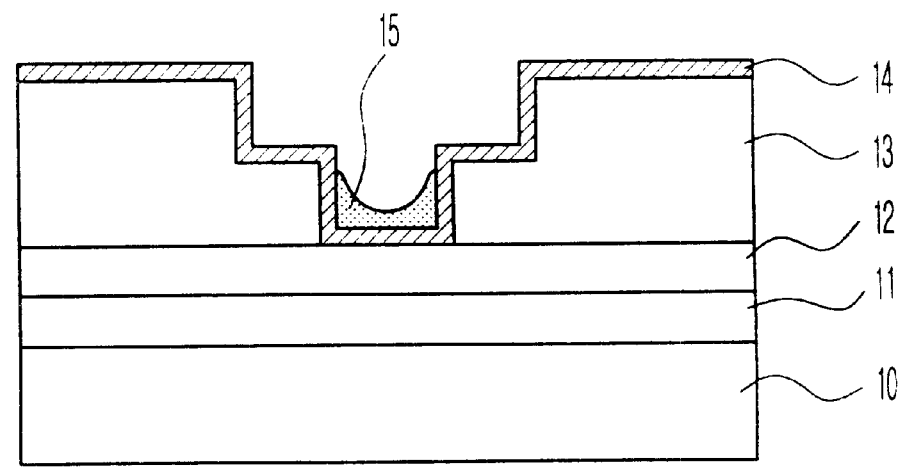

Referring now to FIG. 1C, a portion of the chemical enhancer layer 15a is removed by plasma process or radical plasma process, so that the chemical enhancer layer 15 having select distribution remains only at the sidewall and bottom of the diffusion prevention film 14. The radical plasma process employs a remote plasma method. The plasma process is performed under the conditions that the temperature ranges from about 10 to about 350° C. and the chamber pressure ranges from about 0.3 to about 10 Torr. Also, the flow rate of the gas ranges from about 50 to about 500 sccm under the gas atmosphere including at least one of hydrogen, argon, oxygen, ozone, $NH_3$, nitrogen, hydrogen+argon, hydrogen+$NH_3$ with the plasma generating power ranging from about 50 to about 7000 W for a time period ranging from about 10 to about 600 seconds.

The method of removing the chemical enhancer layer includes a multiple-step by which the plasma process and purge process are repeatedly performed more than at least one times.

Figure 1D:
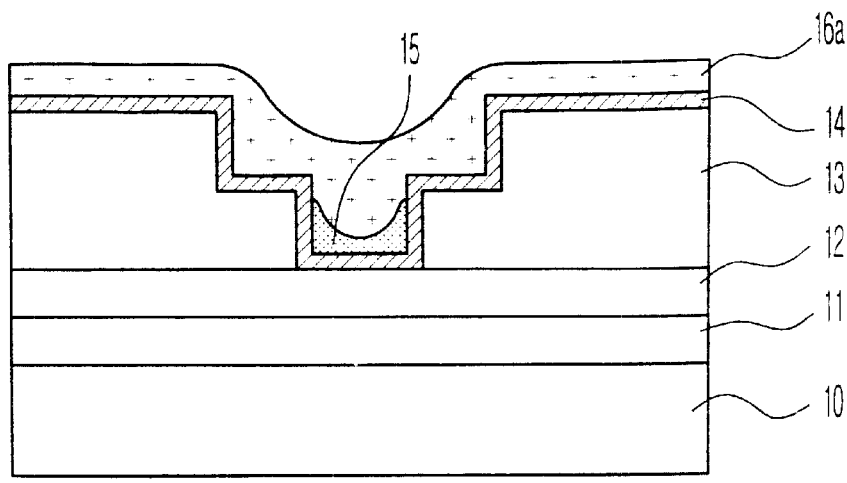

Referring now to FIG. 1D, a copper layer 16a is formed on the second insulating film 13 including the damascene pattern by means of metal organic chemical vapor deposition (MOCVD) method using at least one of all the precursors using hfac such as (hfac)CuVTMOS series, (hfac)CuDMB series, (hfac)CuTMVS series, etc., so that the damascene pattern is filled with copper. As the chemical enhancer layer 15 is remained only at the bottom of the damascene pattern, the deposition speed of copper at this portion than other portion is further accelerated, so that selective copper deposition onto the damascene pattern is possible. The selective deposition process may be performed in a deposition apparatus having at least one vaporizer of direct liquid injection (DLI), control evaporation mixer (CEM), orifice scheme and spray scheme.

In the above, the copper layer 16a may be formed by performing the selective process until the damascene pattern is sufficiently filled or by completely filling the damascene pattern by means of electroplating method after the selective deposition process is performed so that only the via region of the damascene pattern can be sufficiently filled.

Figure 1E:
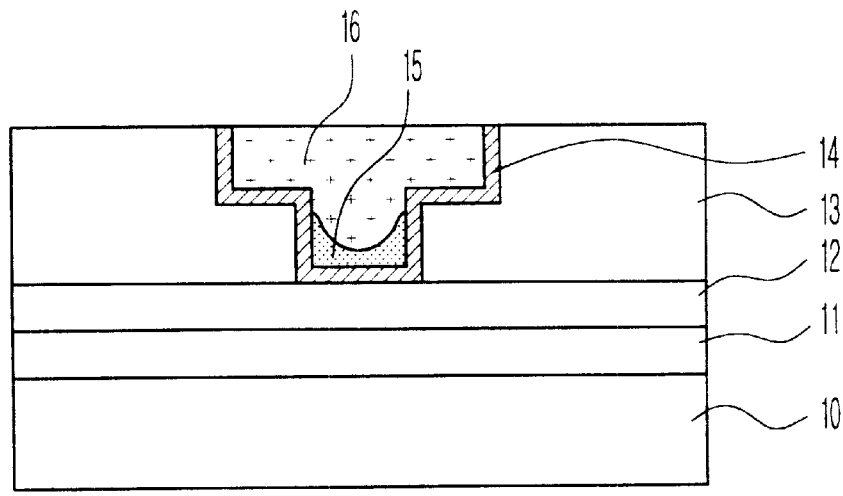

Referring now to FIG. 1E, a hydrogen reduction annealing process is performed. Then, the copper layer 16a and the diffusion prevention film 14 that are deposited on the second insulating film 13 except for the internal of the damascene pattern, are removed by chemical mechanical polishing (CMP), thus forming a copper wiring 16. Sometimes, a copper layer is formed on the second insulating film 13 but is accelerated by the chemical enhancer layer 15. Therefore, as the copper layer is very thin comparing to the thickness of the deposited copper layer, it can be easily removed by CMP process.

In the above embodiment, in order to form a wiring, copper (Cu) has been used. However, it should be noted that other metals such as aluminum or tungsten may be used instead.

As mentioned above, the chemical enhancer layers remain only at the sidewall and bottom of the diffusion prevention film in the via region, thus allowing selective deposition process of copper. Therefore, a subsequent chemical mechanical polishing process can easily be performed and a copper filling process of forming a copper wiring in an ultra-fine texture.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of forming a metal wiring in a semiconductor device, comprising:
   providing a substrate on which an insulating film having a damascene pattern having a bottom is formed;
   forming a diffusion prevention film on the insulating film;
   forming a chemical enhancer layer on the diffusion prevention film;
   performing a plasma process so that the chemical enhancer layer remains only at the bottom of the damascene pattern;
   forming a copper layer by means of chemical vapor deposition method; and
   performing a hydrogen reduction annealing and a chemical mechanical polishing process to form a copper metal wiring.

2. The method of claim 1, further comprising performing a RF plasma cleaning process before formation of the diffusion prevention film and wherein the lower metal layer comprises W and Al.

3. The method of claim 1, further comprising performing a reactive cleaning process before formation the diffusion prevention film and wherein the lower metal layer comprises Cu.

4. The method of claim 1, wherein the diffusion prevention film is formed using at least one selected from the group consisting of ionized PVD TiN, CVD TiN, MOCVD TiN, ionized PVD Ta, ionized PVD TaN, CVD Ta, CVD TaN, CVD WN, CVD TiAlN, CVD TiSiN and CVD TaSiN.

5. The method of claim 1, further including performing a plasma process on the surface of the diffusion prevention film after formation of the diffusion prevention film.

6. The method of claim 1, further including the step of forming a seed layer having a thickness ranging from about 50 to about 500 Å after formation of the diffusion prevention film.

7. The method of claim 1, wherein the chemical enhancer layer is formed with a thickness ranging from about 50 to about 500 Å, with a catalyst selected from the group consisting of I (iodine)-containing liquid compound, Hhfac1/2H$_2$O, Hhfac, TMVS, pure I$_2$, and I (iodine)-containing gas with water vapor at a temperature ranging from about −20 to about 30° C. for a time period ranging from about 1 to about 600 seconds.

8. The method of claim 7, wherein the I (iodine)-containing liquid compound is selected from the group consisting of CH$_3$I, C$_2$H$_5$I CD$_3$I and CH$_2$I$_2$.

9. The method of claim 1, wherein the chemical enhancer layer is formed with a thickness ranging from about 50 to about 500 521 , with a catalyst selected from the group consisting of F, Cl, Br, I and At in a liquid state at a temperature ranging from about −20 to about 300° C. for a time period ranging from about 1 to about 600 seconds.

10. The method of claim 1, wherein the chemical enhancer layer is formed with a thickness ranging from about 50 to about 500 Å, with a catalyst selected from the group consisting of F, Cl, Br, I and At in a gas state at a temperature ranging from about −20 to about 300° C. for a time period ranging from about 1 to about 600 seconds.

11. The method of claim 1, wherein the plasma process is a radical plasma process using a remote plasma method, using one of a single frequency and a dual frequency.

12. The method of claim 11, wherein the radical plasma process comprises repeatedly removing the chemical enhancer layer and purging.

13. The method of claim 1, wherein the plasma process is performed under a gas atmosphere selected from the group consisting of hydrogen; argon; oxygen; ozone; NH$_3$; nitrogen; hydrogen and argon hydrogen and NH$_3$ and mixtures thereof and at a flow rate ranging from about 50 to about 500 sccm.

14. The method of claim 1, wherein the plasma process is performed with a plasma generating power ranging from about 50 to about 7000 W for a time period ranging from about 10 to about 600 seconds.

15. The method of claim 1, wherein the plasma process is performed at a temperature ranging from about 10 to about 350° C. and at a chamber pressure ranging from about 0.3 to about 10 Torr.

16. The method of claim 1, wherein the copper layer is formed in a deposition apparatus by means of a metal organic chemical vapor deposition (MOCVD) method, using at least one precursors selected from the group consisting of (hfac)CuVTMOS series, (hfac)CuDMB series, (hfac)CuTMVS series.

17. The method of claim 1, wherein the copper layer is formed by depositing copper at a given thickness by CVD method and then filling the damascene pattern by means of an electroplating method.

* * * * *

UNITED STATES PATENT AND TRADEMARK OFFICE
CERTIFICATE OF CORRECTION

PATENT NO. : 6,436,826 B1
DATED : August 20, 2002
INVENTOR(S) : Sung Gyu Pyo

It is certified that error appears in the above-identified patent and that said Letters Patent is hereby corrected as shown below:

Column 4,
Line 21, after "from about…" please delete "-20 to about 30°C" and insert -- -20 to about 300°C -- in its place.
Line 28, after "ranging from about…" please delete "50 to about 500 521" and insert -- 50 to about 500Å --.

Signed and Sealed this

Twentieth Day of May, 2003

JAMES E. ROGAN
*Director of the United States Patent and Trademark Office*